United States Patent
Lu et al.

(10) Patent No.: US 12,408,289 B2
(45) Date of Patent: Sep. 2, 2025

(54) OPERATION AND MAINTENANCE DEVICE AND CABINET HAVING THE SAME

(71) Applicant: Fulian Precision Electronics (Tianjin) Co., LTD., Tianjin (CN)

(72) Inventors: Wen-Hu Lu, Tianjin (CN); Li-Yi Yin, Tianjin (CN); Shu-Tong Wang, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 172 days.

(21) Appl. No.: 18/213,856

(22) Filed: Jun. 25, 2023

(65) Prior Publication Data

US 2024/0295139 A1   Sep. 5, 2024

(30) Foreign Application Priority Data

Mar. 2, 2023   (CN) .......................... 202310196537.9

(51) Int. Cl.
*G06F 1/18* (2006.01)
*H05K 5/02* (2006.01)
*H05K 7/14* (2006.01)

(52) U.S. Cl.
CPC ........... *H05K 7/1489* (2013.01); *G06F 1/187* (2013.01); *H05K 5/0221* (2013.01); *H05K 5/0217* (2013.01); *H05K 7/14* (2013.01); *H05K 7/1487* (2013.01); *H05K 7/1488* (2013.01)

(58) Field of Classification Search
CPC ...... H05K 7/14; H05K 7/1489; H05K 5/0221; H05K 7/1487; H05K 5/0217; G06F 1/187
See application file for complete search history.

(56) References Cited

U.S. PATENT DOCUMENTS

| | | | |
|---|---|---|---|
| 10,015,892 B1 * | 7/2018 | Chien | H05K 5/15 |
| 2011/0049317 A1 * | 3/2011 | Peng | G06F 1/187 |
| | | | 248/231.9 |
| 2022/0192046 A1 * | 6/2022 | Wu | G06F 1/188 |

* cited by examiner

*Primary Examiner* — Kimberley S Wright
(74) *Attorney, Agent, or Firm* — ScienBiziP, P.C.

(57) ABSTRACT

An operation and maintenance device includes a floating tray, an unlocking assembly, and a hook assembly. The unlocking assembly movably disposed on the floating tray, one end of the unlocking assembly includes a first mounting frame. The hook assembly connected to the unlocking assembly, the hook assembly comprising a second mounting frame and a hook connected to the second mounting frame, the second mounting frame is rotatably connected to the first mounting frame to drive the hook to rotate and be engaged with the slidable locking mechanism, the unlocking assembly is used to drive the hook to translate. In addition, the present disclosure also provides a cabinet.

18 Claims, 11 Drawing Sheets

OPERATION AND MAINTENANCE DEVICE AND CABINET HAVING THE SAME

FIELD

The subject matter herein generally relates to an operation and maintenance device, particularly to an operation and maintenance device for servers and a cabinet having the operation and maintenance device.

BACKGROUND

Hard disks need to be installed in a server cabinet. For rearrangement and maintenance purposes, the hard disks may be frequently installed into and removed from the cabinet.

However, when removing the hard disks from the cabinet, a top cover of the cabinet needs to be opened, or other components of the cabinet need to be removed to expose the hard disks, resulting in a low efficiency.

BRIEF DESCRIPTION OF THE DRAWINGS

Implementations of the present technology will now be described, by way of example only, with reference to the attached figures, wherein.

DETAILED DESCRIPTION

Figure 1:
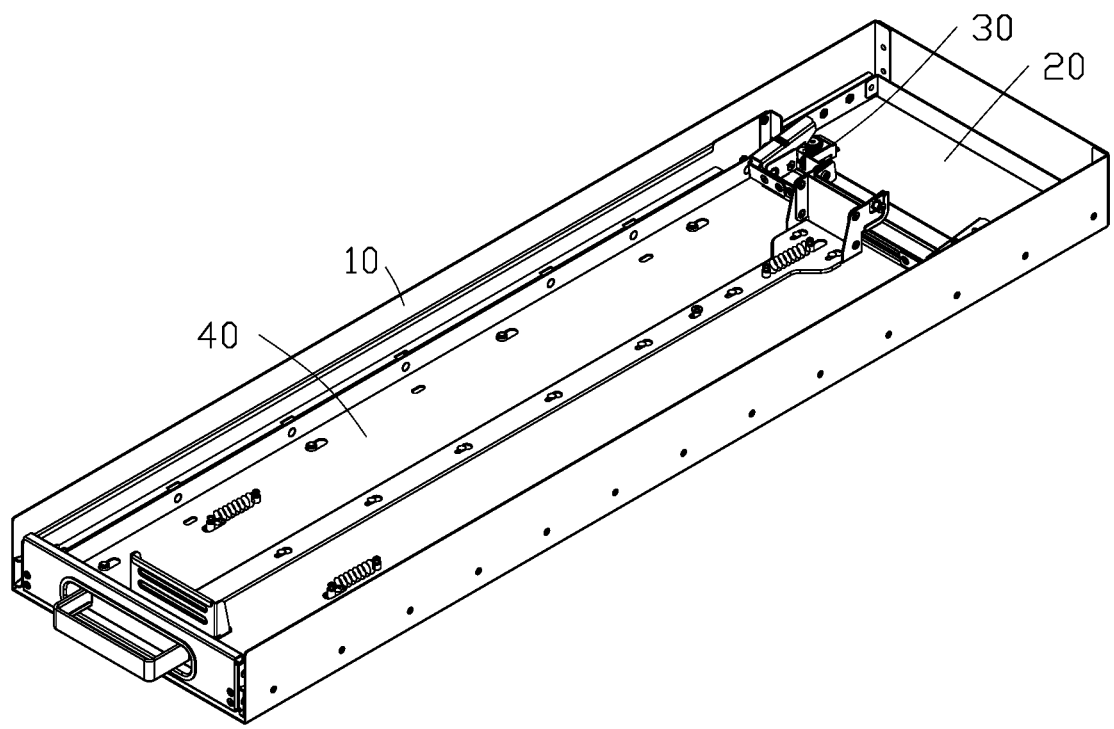
FIG. 1 is a diagrammatic view of a cabinet according to an embodiment of the present disclosure.

It will be appreciated that for simplicity and clarity of illustration, where appropriate, reference numerals have been repeated among the different FIG.s to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Figure 2:
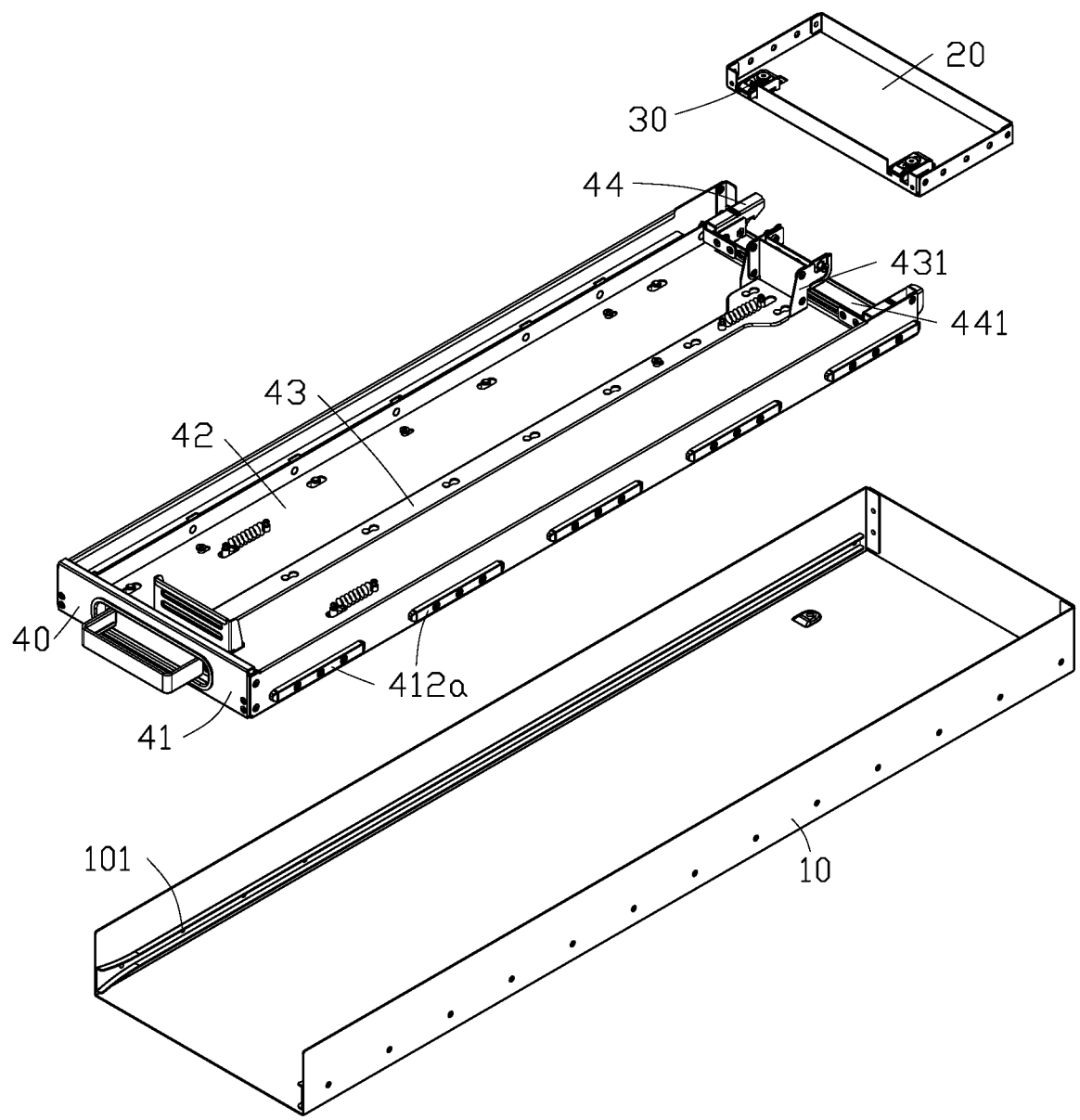
FIG. 2 is an exploded view of the cabinet of FIG. 1.

Referring to FIGS. 1 and 2, an embodiment of the present application provides a cabinet 100, which may be used to install hard disks (not labeled) therein.

The cabinet 100 includes a chassis 10, a storage tray 20, a slidable locking mechanism 30, and an operation and maintenance device 40. The storage tray 20 can be used to install the hard disks. The storage tray 20 is detachably fixed in the chassis 10 through the slidable locking mechanism 30. The device 40 can be pushed into the chassis 10, unlock the slidable locking mechanism 30, and pull out the storage tray 20 from the chassis 10.

Figure 8:
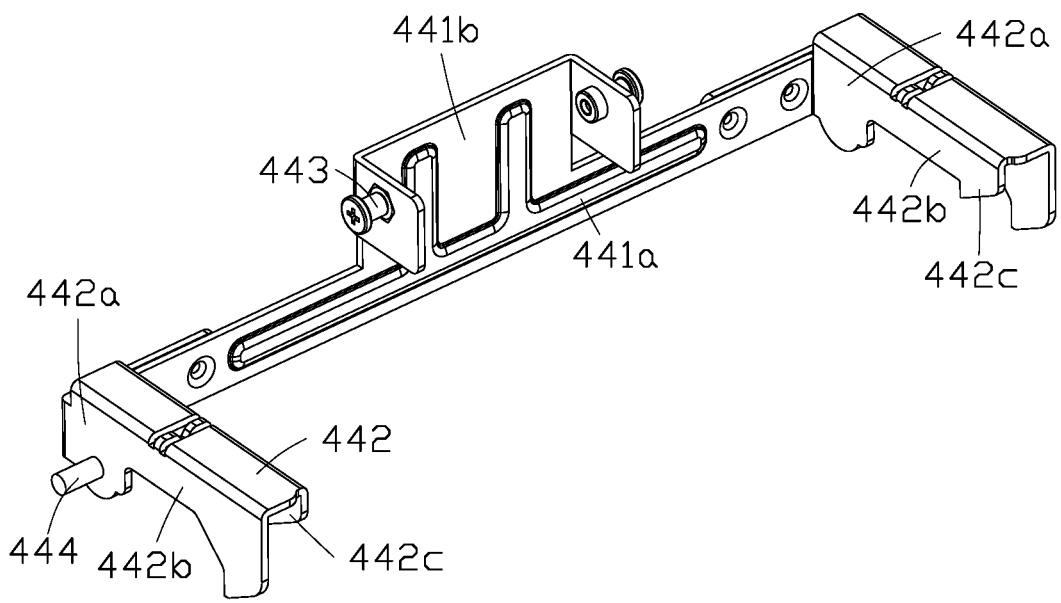
FIG. 8 is a diagrammatic view of a hook assembly of the operation and maintenance device of FIG. 4.

Referring to FIGS. 2 and 8, the device 40 includes a base 41, a floating tray 42 movably disposed on the base 41, an unlocking assembly 43 movably disposed on the floating tray 42, and a hook assembly 44 disposed at one end of the unlocking assembly 43. The unlocking assembly 43 includes a first mounting frame 431. The hook assembly 44 includes a second mounting frame 441 and a hook 442 connecting the second mounting frame 441. The hook 442 can be engaged with or disengaged from the slidable locking mechanism 30. The second mounting frame 441 is rotatably connected to the first mounting frame 431, so that the unlocking assembly 43 can rotate the hook 442 during movement, thereby switching the hook 442 between a first state A and a second state B.

Figure 9:
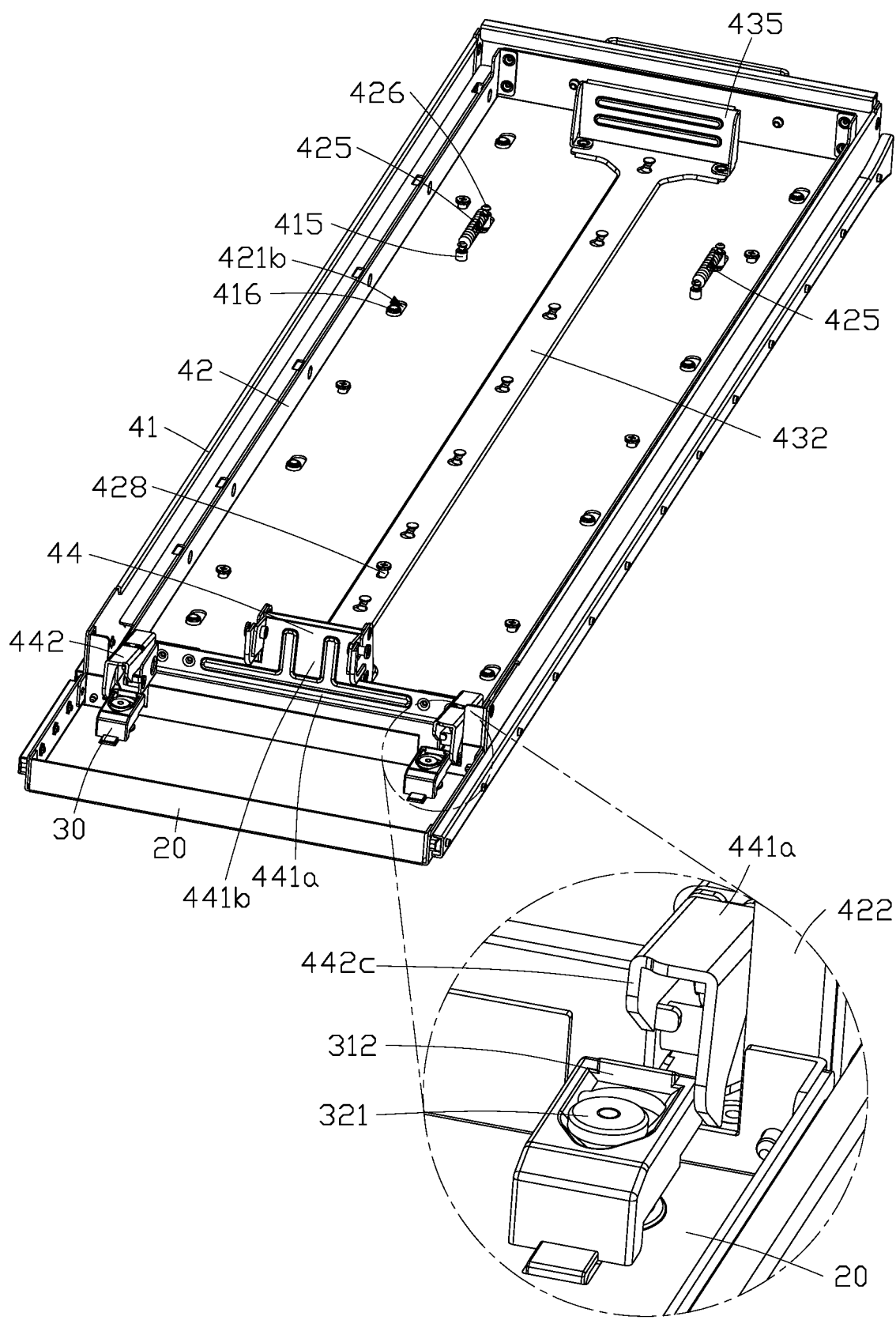
FIG. 9 is a diagrammatic view of the operation and maintenance device of FIG. 4 in a first state.
Figure 10:
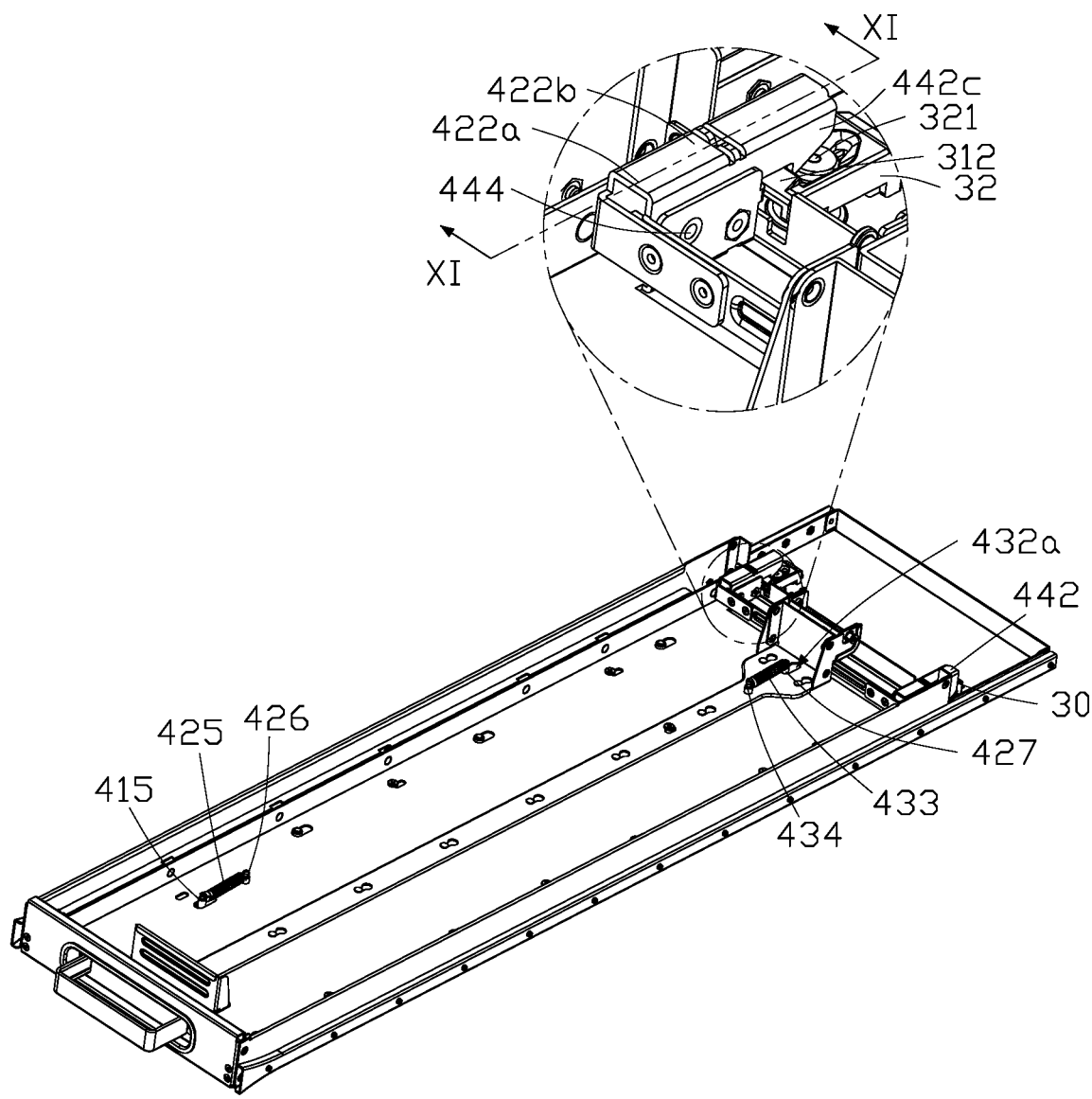
FIG. 10 is a diagrammatic view of the operation and maintenance device of FIG. 4 in a second state.

Referring to FIG. 9, the first state A is that the hook 442 is disengaged from the slidable locking mechanism 30, and the storage tray 20 is connected to the chassis 10 through the slidable locking mechanism 30. Referring to FIG. 10, the second state B is that the hook 442 is engaged with the slidable locking mechanism 30, the slidable locking mechanism 30 is disconnected from the storage tray 20 and the chassis 10, and the storage tray 20 may be separated from the chassis 10 by pulling the unlocking assembly 43 outward.

The cabinet 100 provided by the present application includes the device 40 that can be pushed into the chassis 10. The device 40 is provided with the hook 442 that can be driven by the unlocking assembly 43. The hook 442 can be engaged with the slidable locking mechanism 30 to unlock the storage tray 20 and the chassis 10. Thereby, the storage tray 20 can be separated from the chassis 10 by pulling the unlocking assembly 43 outward, which is conducive to the installation of the storage tray 20 into the chassis 10 and the removal of the storage tray 20 from the chassis 10, and thereby improving the operation and maintenance efficiency of the hard disks.

Figure 3:
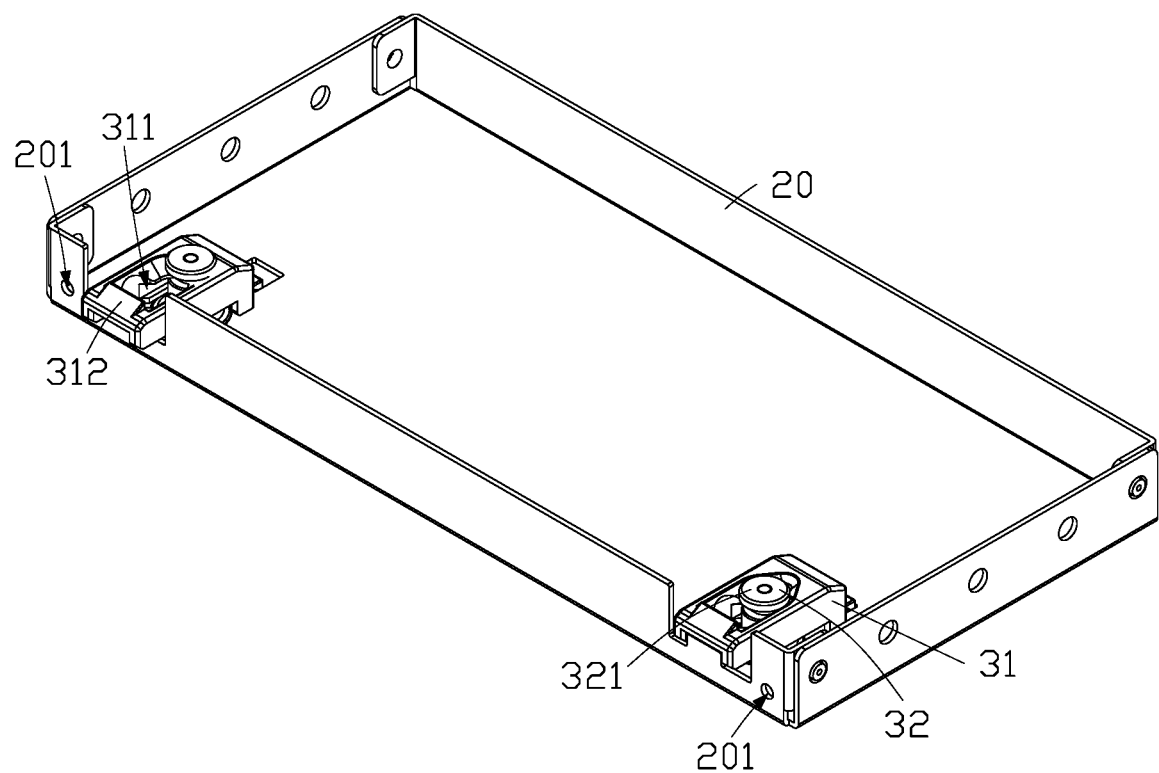
FIG. 3 is a diagrammatic view of a storage tray of the cabinet of FIG. 1.

Referring to FIGS. 2 and 3, in this embodiment, the slidable locking mechanism 30 includes an unlocking slider 31 set in the storage tray 20 and an elastic pin 32 that goes through the unlocking slider 31. The unlocking slider 31 defines a slanted slot 311 for the elastic pin 32 to go through and a protrusion 312 for engaging with the hook 442. An extending direction of an inner wall of the slanted slot 311 is inclined with an extending direction of the elastic pin 32.

The elastic pin 32 includes a first end 321 and a second end 322. A cross-sectional dimension of the first end 321 is greater than a cross-sectional dimension of the second end 322. A cross-sectional dimension of the slanted slot 311 is greater than the cross-sectional dimension of the second end 322 and less than the cross-sectional dimension of the first end 321, allowing the first end 321 to abut against the slanted slot 311, and further allowing the second end 322 to pass through the slanted slot 311 and the storage tray 20 and then to be inserted into the chassis 10. A direction from the protrusion 312 to the slanted slot 311 is substantially parallel to an extension direction of the unlocking assembly 43.

When the slidable locking mechanism 30 locks the storage tray 20, the second end 322 of the elastic pin 32 extends through the slanted slot 311 and the storage tray 20, and is then inserted into the chassis 10, thereby locking the storage tray 20 in the chassis 10.

When the slidable locking mechanism 30 unlocks the storage tray 20, the hook 442 is engaged with the protrusion 312 and pulls the unlocking slider 31 to move, and the first end 321 of the elastic pin 32 abuts against the slanted slot 311. As the extending direction of the slanted slot 311 is inclined with the extending direction of the elastic pin 32, when the hook 442 pulls the unlocking slider 31 to move, the second end 322 of the elastic pin 32 moves backward to the chassis 10 and exits the chassis 10 and the storage tray 20, thereby unlocking the storage tray 20 and the chassis 10.

Figure 4:
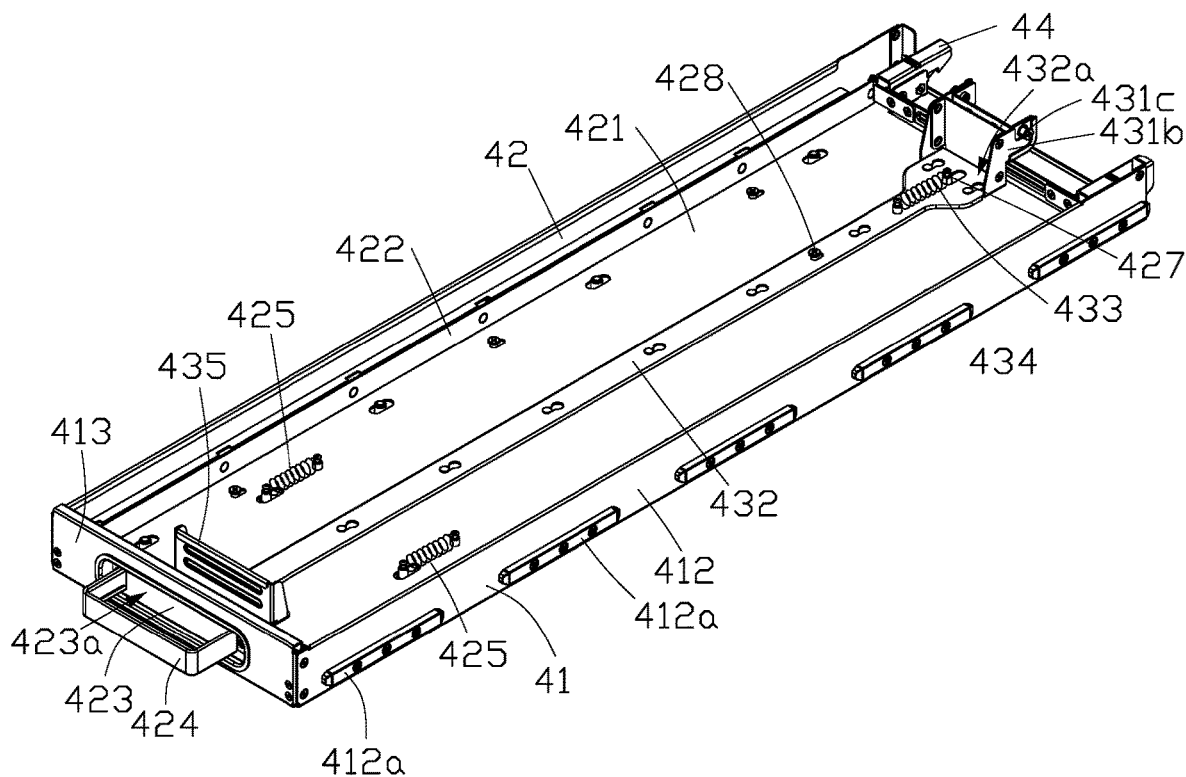
FIG. 4 is a diagrammatic view of an operation and maintenance device of the cabinet of FIG. 1.
Figure 5:
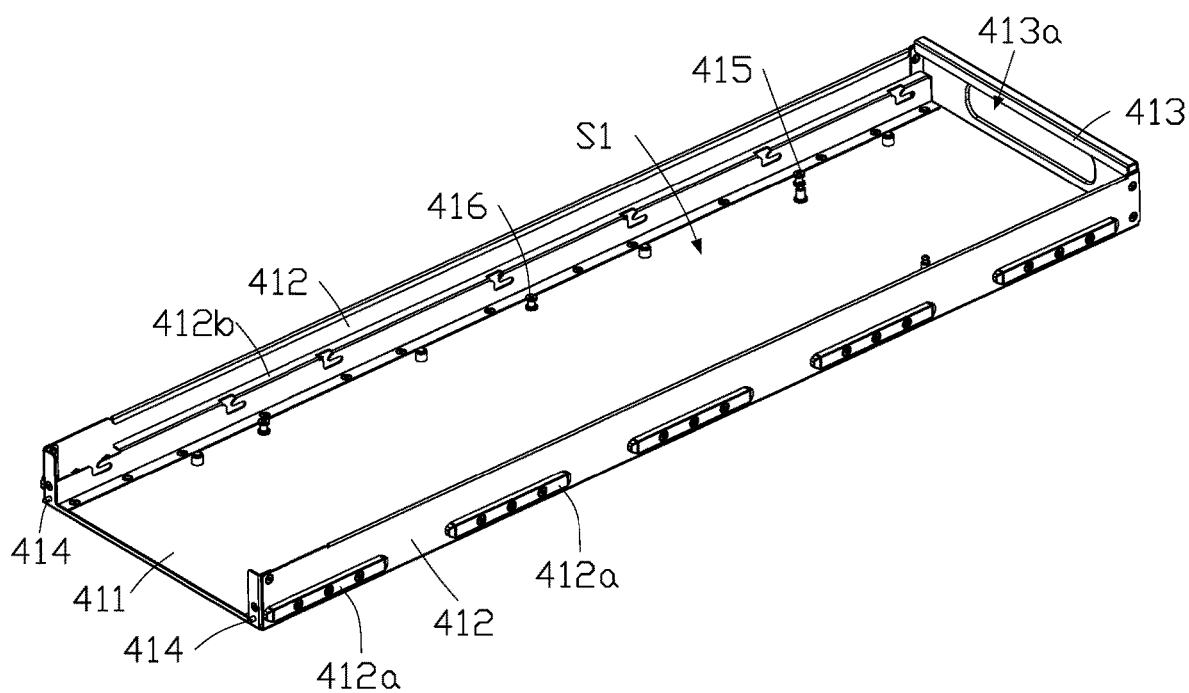
FIG. 5 is a diagrammatic view of a base of the operation and maintenance device of FIG. 4.

Referring to FIGS. 2, 4 and 5, in this embodiment, the base 41 is substantially square and movably disposed within the chassis 10. The base 41 includes a first bottom plate 411, two first side plates 412, a second side plate 413, and a plurality of positioning pins 414. The two first side plates 412 are connected to opposite sides of the first bottom plate 411. Two ends of the second side plate 413 are connected to ends of the two first side plates 412. The second side plate 413 is also connected to the first bottom plate 411. The two first side plates 412, the second side plate 413, and the first bottom plate 411 together form a first accommodating space S1. The floating tray 42 is movably accommodated in the first accommodating space S1. The positioning pins 414 are respectively disposed at other ends of the two first side plates 412 away from the second side plate 413. One end of the storage tray 20 facing the device 40 defines a plurality of positioning holes 201. The positioning pins 414 are used to insert into the positioning holes 201 of the storage tray 20.

Referring to FIGS. 2, 4 and 5, in this embodiment, the first side plate 412 is provided with a slider 412a, and a slider slot 101 is defined in the chassis 10. The slider 412a is engaged with the slider slot 101, allowing the base 41 to movably disposed with the chassis 10 along an extension direction of the slider slot 101. In other embodiments, the movable connection between the base 41 and the chassis 10 may also be realized by means of wheels or sliding bearings.

Referring to FIGS. 2, 4 and 5, in this embodiment, the floating tray 42 includes a second bottom plate 421, two first side panels 422, a second side panel 423, and a first handle 424. The two first side panels 422 are connected to opposite sides of the second bottom plate 421. Two ends of the second side panel 423 are connected to ends of the two first side panels 422. The second side panel 423 is also connected to the second bottom plate 421. The second bottom plate 421, the two second side panels 423, and the second side panel 423 together form a second accommodating space S2. The unlocking assembly 43 is movably disposed in the second accommodating space S2. The first handle 424 is disposed on a side surface of the second side panel 423 away from the second accommodating space S2. The second side plate 413 defines an opening 413a. The first handle 424 can pass through the opening 413a, so as to facilitate an operator to grasp the floating tray 42 and push the floating tray 42 to move relative to the base 41.

Figure 6:
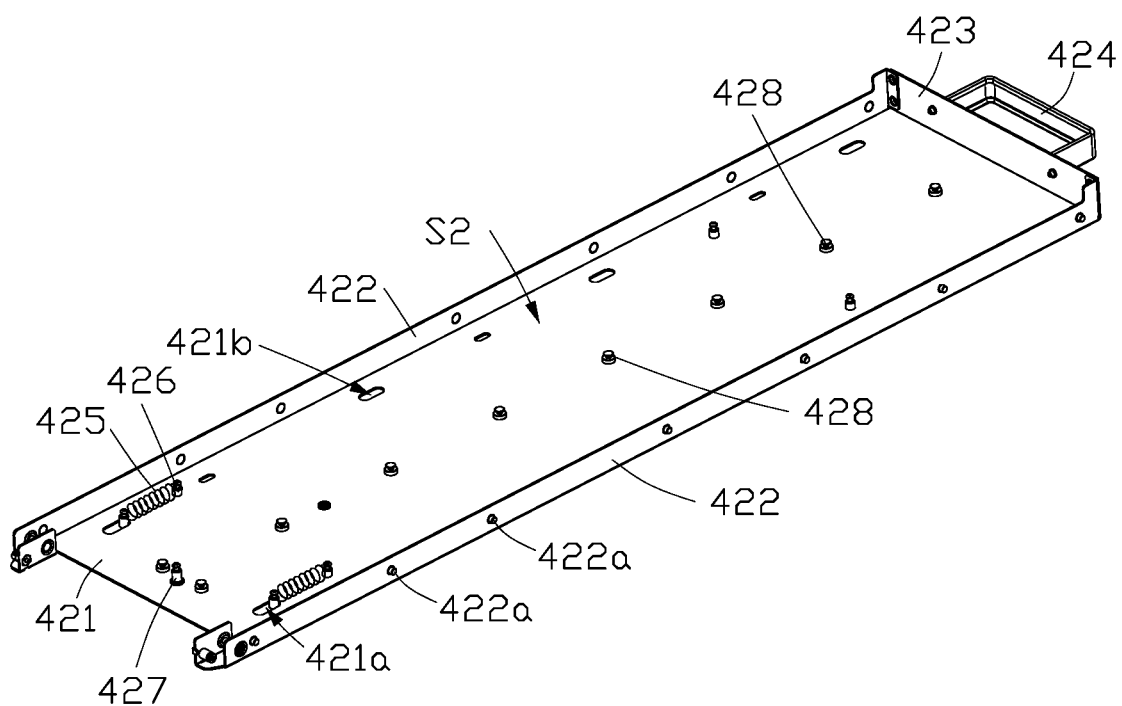
FIG. 6 is a diagrammatic view of a floating tray of the operation and maintenance device of FIG. 4.

Referring to FIGS. 5 and 6, in this embodiment, a side of the first side panel 422 opposite to the second accommodating space S2 is provided with a support column 422a. A side of the first side plate 412 facing the first accommodating space S1 is provided with a support bar 412b. The support column 422a can be placed on and slide relative to the support bar 412b, allowing the floating tray 42 and the base 41 to movably connect to each other.

Referring to FIGS. 4 and 5, in this embodiment, the base 41 further includes a plurality of first fixing pins 415 and a plurality of second fixing pins 416. The first fixing pins 415 and the second fixing pins 416 are disposed on one side of the first bottom plate 411 facing the first accommodating space S1. The first fixing pins 415 and the second fixing pins 416 are symmetrically distributed on opposite sides of the unlocking assembly 43. The first fixing pins 415 and the second fixing pins 416 on are substantially parallel to each other. That is, the first fixing pins 415 and the second fixing pins 416 are substantially distributed along a straight line.

The floating tray 42 further includes a first elastic member 425 and a third fixing pin 426. The third fixing pin 426 is disposed on one side of the second bottom plate 421 facing the second accommodating space S2. The second bottom plate 421 defines a first sliding slot 421a and a second sliding slot 421b, and each of the first sliding slot 421a and the second sliding slot 421b penetrates the second bottom plate 421. The first fixing pin 415 movably extends through the first sliding slot 421a, and the second fixing pin 416 movably extends through the second sliding slot 421b. The first elastic member 425 is connected between the first fixing pin 415 and the third fixing pin 426.

The second fixing pin 416 and the second sliding slot 421b may be used to limit a moving direction and a moving range of the floating tray 42 relative to the base 41. The connection of the first elastic member 425 between the first fixing pin 415 and the third fixing pin 426 allows the floating tray 42 to store an elastic energy during the movement of floating tray 42 relative to the base 41. The elastic energy can provide a buffer to a collision between the second fixing pin 416 and the sliding slot 421b.

Referring to FIGS. 4 and 6, in this embodiment, the floating tray 42 further includes a plurality of first fixing columns 427 and a plurality of second fixing columns 428. The first fixing columns 427 and the second fixing columns 428 are disposed on one side of the second bottom plate 421 facing the second accommodating space S2. The first fixing columns 427 and the second fixing columns 428 are spaced from each other. The first fixing columns 427 are disposed at one end of the second bottom plate 421 away from the second side panel 423. The second fixing columns 428 are spaced apart from each other on the second bottom plate 421, along a length direction of the second bottom plate 421. The first fixing columns 427 and the second fixing columns 428 are substantially arranged in a straight line.

Figure 7:
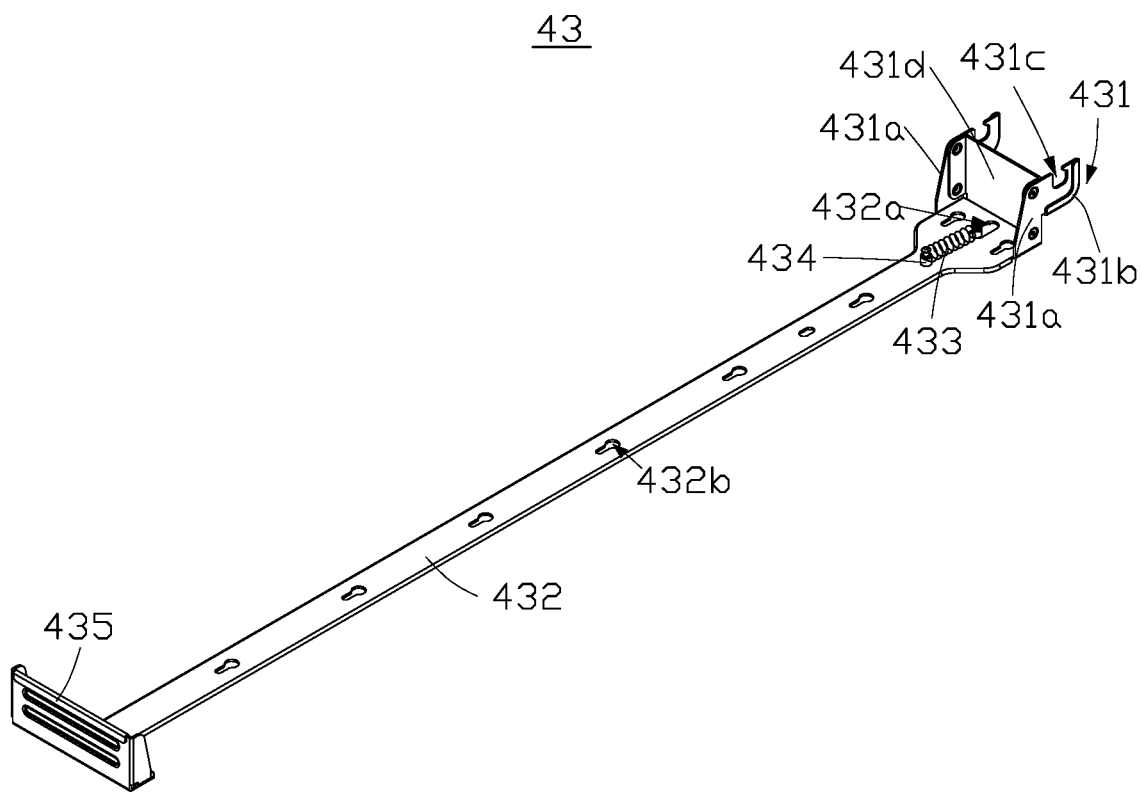
FIG. 7 is a diagrammatic view of an unlocking assembly of the operation and maintenance device of FIG. 4.

Referring to FIGS. 6 and 7, the unlocking assembly 43 includes a pull rod 430, a second elastic member 433, and a third fixing column 434. The pull rod 430 includes a pull rod body 432. The third fixing column 434 is connected to one side of the pull rod body 432 facing away from the second accommodating space S2. The pull rod body 432 defines a first limiting slot 432a and a plurality of second limiting slots 432b. The first limiting slot 432a is disposed at one end of the pull rod body 432 close to the first mounting frame 431. The second limiting slots 432b are spaced apart along a length direction of the pull rod body 432.

The first fixing column 427 movably goes through the first limiting slot 432a, and the second fixing column 428 movably goes through each of the second limiting slots 432b. The second elastic member 433 is connected between the first fixing column 427 and the third fixing column 434. The second fixing column 428 and the second limiting slot 432b can be used to limit a moving direction and a moving range of the unlocking assembly 43 relative to the floating tray 42. Two ends of the second elastic member 433 are respectively connected to the first fixing column 427 and the third fixing column 434, so that when the unlocking assembly 43 moves relative to the base 41, an elastic energy can be stored, and the collision between the second fixing column 428 and the second limiting slot 432b can be buffered.

Referring to FIGS. 4 and 7, in this embodiment, the unlocking assembly 43 further includes a second handle 435. The second handle 435 is disposed at one end of the pull rod body 432 facing away from the first mounting frame 431. The second handle 435 can be used to facilitate the operators to grasp the pull rod body 432 and push the first mounting frame 431 to move relative to the floating tray 42.

Referring to FIGS. 7 and 8, in this embodiment, the first mounting frame 431 is disposed at one end of the pull rod body 432. The first mounting frame 431 has a substantially symmetrical structure. The first mounting frame 431 includes two spaced support plates 431a, a support wing 431b disposed at one end of each support plate 431a facing away from the pull rod body 432, and a connecting plate 431d connected between the two support plates 431a. Each support wing 431b is substantially vertically connected to the support plate 431a and extends backward from the pull rod body 432. Each support wing 431b defines a shaft groove 431c on a side facing away from the pull rod body 432.

Referring to FIG. 8, the hook assembly 44 includes a second mounting frame 441. The second mounting frame 441 is substantially inverted T-shaped. The second mounting frame 441 includes a crossbar 441a, a column 441b disposed on one side of the crossbar 441a, and hooks 442 formed by substantially vertically extending from both ends of the crossbar 441a. Opposite sides of the column 441b are provided with first rotating shafts 443. Each first rotating shaft 443 is rotatably accommodated in the corresponding shaft groove 431c.

Referring to FIGS. 8 and 9, the hook 442 is substantially L-shaped. The hook 442 includes a first portion 442a, a second portion 442b, and a third portion 442c. The second portion 442b is connected between the first portion 442a and the third portion 442c. The third portion 442c extends substantially perpendicular to the second portion 442b and is used to hook the protrusion 312. The first portion 442a is connected to the crossbar 441a, and one side of the first portion 442a extending away from the other hook 442 is provided with a second rotating shaft 444. The hook 442 is rotatably connected to the first side panel 422 of the floating tray 42 through the second rotating shaft 444. When the unlocking assembly 43 is pushed, the support wing 431b can push the column 441b to cause the first portion 442a of the hook 442 to rotate around the first side panel 422. The rotation of the first portion 442a can drive the third portion 442c to rotate, and the third portion 442c can hook the protrusion 312 of the unlocking slider 31 (FIG. 10).

Figure 11:
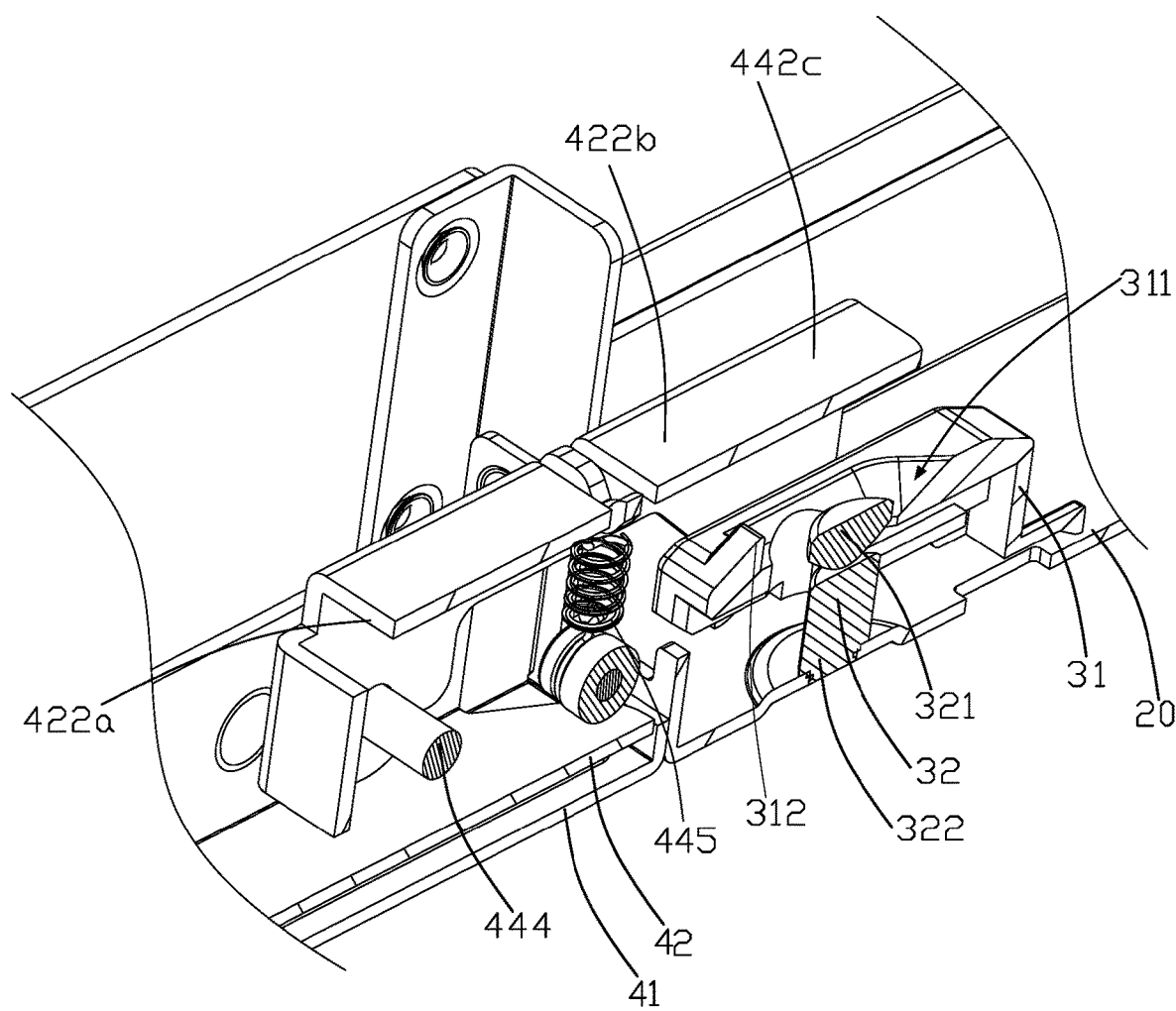
FIG. 11 is a cross-sectional view along line XI-XI of FIG. 10.

Referring to FIG. 11, in this embodiment, the hook assembly 44 further includes a third elastic member 445. The third elastic member 445 is connected between the second portion 442b and the first side panel 422 of the floating tray 42, so that when the hook 442 rotates around the second rotating shaft 444, the third elastic member 445 can obtain elastic potential energy to facilitate the hook 442 to return to a position before rotation.

The embodiments shown and described above are only examples. Many details are often found in the art such as the other features of the device 40. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. An operation and maintenance device applied in a chassis, a storage tray is connected to the chassis through a slidable locking mechanism, the operation and maintenance device comprising:
    a floating tray;
    an unlocking assembly movably disposed on the floating tray, the unlocking assembly comprising a first mounting frame;
    a hook assembly connected to the unlocking assembly, the hook assembly comprising a second mounting frame and a hook connected to the second mounting frame, wherein the second mounting frame is rotatably connected to the first mounting frame, and is configured to drive the hook to rotate, thereby causing the hook to be engaged with the slidable locking mechanism, the unlocking assembly is configured to drive the hook to move, thereby causing the slidable locking mechanism to disengage a connection between the chassis and the storage tray; and
    a base, wherein the base comprises a first bottom plate, two first side plates, a second side plate, and a plurality of positioning pins, wherein
        the two first side plates are disposed on opposite sides of the first bottom plate, the second side plate are connected between the two first side plates; and
        the first bottom plate, the two first side plates, and the second side plate together form a first accommodating space, the floating tray is movably disposed in the first accommodating space, and the plurality of the positioning pins is disposed at ends of the two first side plates away from the second side plate.

2. The operation and maintenance device of claim 1, wherein the floating tray comprises a second bottom plate, two first side panels, a second side panel, and a handle, the two first side panels are disposed on opposite sides of the second bottom plate, the second side panel is connected between the two first side panels;
    the second bottom plate, the two first side plates, and the second side plate together form a second accommodating space; and
    the unlocking assembly is movably disposed in the second accommodating space, and the handle is disposed on a side of the second side plate away from the second accommodating space.

3. The operation and maintenance device of claim 2, wherein the second side plate defines an opening, and the handle extends through the opening.

4. The operation and maintenance device of claim 2, wherein a side of one of the first side panels is provided with a support column away from the second accommodating space, a side of another one of the first side plates is provided with a support bar facing the first accommodating space, the support column is movably disposed on the support bar.

5. The operation and maintenance device of claim 3, wherein the base further comprises a first fixing pin and a second fixing pin, the first fixing pin and the second fixing pin are disposed on a side of the first bottom plate facing the first accommodating space, and the first fixing pin and the second fixing pin are spaced from each other; and the floating tray further comprises a first elastic member and a third fixing pin, the third fixing pin is disposed on a side of the second bottom plate facing the second accommodating space, the second bottom plate defines a first sliding slot and a second sliding slot, the first fixing pin movably extends through the first sliding slot, the second fixing pin movably extends through the second sliding slot, and the first elastic member is connected between the first fixing pin and the third fixing pin.

6. The operation and maintenance device of claim 4, wherein the floating tray further comprises a first fixing column and a second fixing column, the first fixing column and the second fixing column are disposed on a side of the second bottom plate facing the second accommodating space, and the first fixing column and the second fixing column are spaced from each other; and the unlocking assembly further comprises a pull rod body, a second elastic member, and a third fixing column, the third fixing column is disposed on a side of the pull rod body away from the second accommodating space, the pull rod body defines a first limiting slot and a second limiting slot, the first fixing column movably extends through the first limiting slot, the second fixing column movably extends through the second limiting slot, and the second elastic member is connected between the first fixing column and the third fixing column.

7. The operation and maintenance device of claim 1, wherein the first mounting frame comprises a support plate and a support wing connected to the support plate, one end of the support plate away from the support wing is connected to the unlocking assembly, and the support wing defines a shaft groove;

the hook assembly further comprises a first rotating shaft and a second rotating shaft, the first rotating shaft is disposed at one end of the second mounting frame away from the hook, and the first rotating shaft is rotatably accommodated in the shaft groove; and the hook comprises a first portion, a second portion, and a third portion, the first portion is connected to another end of the second mounting frame, the second portion is connected between the first portion and the third portion, and the first portion is rotatably connected to one end of the floating tray through the second rotating shaft.

8. The operation and maintenance device of claim 7, wherein the hook assembly further comprises a third elastic member, and the third elastic member is connected between the second portion and the floating tray.

9. The operation and maintenance device of claim 7, wherein the second mounting frame comprises a crossbar and a column disposed on one side of the crossbar, one end of the crossbar is connected to the hook, one side of the column is connected to the first rotating shaft.

10. A cabinet comprising:
a chassis;
a storage tray removably disposed in the chassis;
a slidable locking mechanism connecting the chassis and the storage tray; and
an operation and maintenance device comprising:
a floating tray;
an unlocking assembly movably disposed on the floating tray, the unlocking assembly comprising a first mounting frame; and a hook assembly connected to the unlocking assembly, the hook assembly comprising a second mounting frame and a hook connected to the second mounting frame, wherein the second mounting frame is rotatably connected to the first mounting frame, and is configured to drive the hook to rotate, thereby switching the hook between a first state and a second state;

wherein the first state is that the hook is disengaged from the slidable locking mechanism, and the slidable locking mechanism connects the storage tray to the chassis; the second state is that the hook is engaged with the slidable locking mechanism, and the slidable locking mechanism unlocks the storage tray and the chassis;

the operation and maintenance device further comprising a base, wherein the base comprises a first bottom plate, two first side plates, a second side plate, and a plurality of positioning pins;

the two first side plates are disposed on opposite sides of the first bottom plate, the second side plate are connected between the two first side plates; and the first bottom plate, the two first side plates, and the second side plate together form a first accommodating space, the floating tray is movably disposed in the first accommodating space, and the plurality of the positioning pins is disposed at ends of the two first side plates away from the second side plate.

11. The cabinet of claim 10, wherein the slidable locking mechanism comprises:

an elastic pin disposed on the storage tray, the elastic pin comprises a first end and a second end, the first end extends through the storage tray to insert into a pin hole in the chassis, a cross-sectional dimension of the first end is less than a cross-sectional dimension of the second end; and an unlocking slider defines an slanted slot, the elastic pin movably extends through the slanted slot, the second end abuts against an inner wall of the slanted slot, and an extending direction of the slanted slot is inclined with respect to an extending direction of the elastic pin, a cross-sectional dimension of the slanted slot is greater than the cross-sectional dimension of the first end and less than the cross-sectional dimension of the second end.

12. The cabinet of claim 10, wherein the floating tray comprises a second bottom plate, two first side panels, a second side panel, and a handle, the two first side panels are disposed on opposite sides of the second bottom plate, the second side panel is connected between the two first side panels;

the second bottom plate, the two first side plates, and the second side plate together form a second accommodating space; and the unlocking assembly is movably disposed in the second accommodating space, and the handle is disposed on a side of the second side plate away from the second accommodating space.

13. The cabinet of claim 12, wherein the second side plate defines an opening, and the handle extends through the opening.

14. The cabinet of claim 12, wherein a side of one of the first side panels is provided with a support column away from the second accommodating space, a side of another one of the first side plate is provided with a support bar facing the first accommodating space, the support column is movably disposed on the support bar.

15. The cabinet of claim 13, wherein the base further comprises a first fixing pin and a second fixing pin, the first fixing pin and the second fixing pin are disposed on a side of the first bottom plate facing the first accommodating space, and the first fixing pin and the second fixing pin are spaced from each other; and the floating tray further comprises a first elastic member and a third fixing pin, the third fixing pin is disposed on a side of the second bottom plate facing the second accommodating space, the second bottom plate defines a first sliding slot and a second sliding slot, the first fixing pin movably extends through the first sliding slot, the second fixing pin movably extends through the second sliding slot, and the first elastic member is connected between the first fixing pin and the third fixing pin.

16. The cabinet of claim 10, wherein the floating tray further comprises a first fixing column and a second fixing column, the first fixing column and the second fixing column are disposed on a side of the second bottom plate facing the second accommodating space, and the first fixing column and the second fixing column are spaced from each other; and the unlocking assembly further comprises a pull rod body, a second elastic member, and a third fixing column, the third fixing column is disposed on a side of the pull rod body away from the second accommodating space, the pull rod body defines a first limiting slot and a second limiting slot, the first fixing column movably extends through the first limiting slot, the second fixing column movably extends through the second limiting slot, and the second elastic member is connected between the first fixing column and the third fixing column.

17. The cabinet of claim 16, wherein the first mounting frame comprises a support plate and a support wing connected to the support plate, one end of the support plate away from the support wing is connected to the unlocking assembly, and the support wing defines a shaft groove;

the hook assembly further comprises a first rotating shaft and a second rotating shaft, the first rotating shaft is disposed at one end of the second mounting frame away from the hook, and the first rotating shaft is rotatably accommodated in the shaft groove; and the hook comprises a first portion, a second portion, and a third portion, the first portion is connected to another end of the second mounting frame, the second portion is connected between the first portion and the third portion, and the first portion is rotatably connected to one end of the floating tray through the second rotating shaft.

18. The cabinet of claim 16, wherein the hook assembly further comprises a third elastic member, and the third elastic member is connected between the second portion and the floating tray.

\* \* \* \* \*